United States Patent
Yoshimizu et al.

(10) Patent No.: US 11,342,182 B2
(45) Date of Patent: May 24, 2022

(54) SUBSTRATE TREATMENT DEVICE, SUBSTRATE TREATMENT METHOD, AND SEMICONDUCTOR DEVICE MANUFACTURING METHOD

(71) Applicant: Kioxia Corporation, Tokyo (JP)

(72) Inventors: Yasuhito Yoshimizu, Yokkaichi Mie (JP); Fuyuma Ito, Yokkaichi Mie (JP); Hakuba Kitagawa, Yokkaichi Mie (JP); Yohei Yamamoto, Yokkaichi Mie (JP); Hisashi Okuchi, Yokkaichi Mie (JP); Yuji Yamada, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/559,518

(22) Filed: Sep. 3, 2019

(65) Prior Publication Data
US 2020/0185221 A1    Jun. 11, 2020

(30) Foreign Application Priority Data

Dec. 11, 2018  (JP) .............................. JP2018-231736

(51) Int. Cl.
*H01L 21/02* (2006.01)
*B05C 11/08* (2006.01)
(Continued)

(52) U.S. Cl.
CPC ........ *H01L 21/02672* (2013.01); *B05C 11/08* (2013.01); *B08B 3/08* (2013.01);
(Continued)

(58) Field of Classification Search
USPC ........... 118/52, 55, 612, 313, 315, 319, 320; 210/679, 681; 451/41; 134/902;
(Continued)

(56) References Cited

U.S. PATENT DOCUMENTS 5,854,096 A    12/1998  Ohtani
5,968,268 A *  10/1999  Kitano ................ H01L 21/6715
                                                          118/52
(Continued)

FOREIGN PATENT DOCUMENTS

JP    H07-307286 A    11/1995
JP    2002-231630 A    8/2002
(Continued)

OTHER PUBLICATIONS

Meng et al., "Polycrystalline Silicon Films and Thin-Film Transistors Using Solution-Based Metal-Induced Crystallization", Journal of Display Technology, vol. 2, No. 3, Sep. 2006, pp. 265-273.

*Primary Examiner* — Yewebdar T Tadesse
(74) *Attorney, Agent, or Firm* — Foley & Lardner LLP

(57) ABSTRACT

According to an embodiment, the substrate treatment device includes a dilutor configured to dilute a first liquid containing a metal ion and exhibiting acidity. The device further includes a pH changer configured to change a pH of the first liquid before or after being diluted by the dilutor. The device further includes a substrate conditioner configured to treat the substrate using the first liquid, which is diluted by the dilutor and with the pH changed by the pH changer.

11 Claims, 8 Drawing Sheets

(51) Int. Cl.
  *B08B 3/08* (2006.01)
  *H01L 21/67* (2006.01)
  *H01L 27/11556* (2017.01)
  *H01L 27/11582* (2017.01)

(52) U.S. Cl.
  CPC .... *H01L 21/6715* (2013.01); *H01L 27/11556* (2013.01); *H01L 27/11582* (2013.01)

(58) Field of Classification Search
  USPC ..................................................... 366/152.1
  See application file for complete search history.

(56) References Cited

U.S. PATENT DOCUMENTS

| | | |
|---|---|---|
| 6,077,731 A | 6/2000 | Yamazaki |
| 6,162,667 A | 12/2000 | Funai |
| 6,811,962 B2 * | 11/2004 | Yoshihara ................ G03D 3/06 396/611 |
| 6,861,338 B2 | 3/2005 | Maekawa |
| 6,867,432 B1 | 3/2005 | Teramoto |
| 6,982,006 B1 * | 1/2006 | Boyers ................... A61L 2/183 134/1 |
| 7,186,601 B2 | 3/2007 | Fukunaga |
| 8,501,025 B2 * | 8/2013 | Hashizume ....... H01L 21/02063 216/83 |
| 9,770,804 B2 * | 9/2017 | Byers ...................... B24B 57/02 |
| 2006/0205325 A1 * | 9/2006 | Abe .......................... C23F 1/46 451/36 |
| 2007/0020918 A1 * | 1/2007 | Hirokawa ........... H01L 21/6715 438/626 |
| 2011/0056913 A1 * | 3/2011 | Mayer ...................... C23F 1/46 216/84 |
| 2018/0090346 A1 * | 3/2018 | Sugioka ........... H01L 21/30604 |

FOREIGN PATENT DOCUMENTS

| | | |
|---|---|---|
| JP | 2002-329870 A | 11/2002 |
| JP | 2002-368226 A | 12/2002 |
| JP | 2003-173967 A | 6/2003 |
| JP | 2006-263693 A | 10/2006 |
| JP | 2008-244025 A | 10/2008 |
| JP | 4364314 B2 | 11/2009 |

* cited by examiner

_US 11,342,182 B2_

SUBSTRATE TREATMENT DEVICE, SUBSTRATE TREATMENT METHOD, AND SEMICONDUCTOR DEVICE MANUFACTURING METHOD

CROSS-REFERENCE TO RELATED APPLICATION(S)

This application is based upon and claims the benefit of priority from Japanese Patent Application No. 2018-231736, filed Dec. 11, 2018, the entire contents of which are incorporated herein by reference.

FIELD

Embodiments described herein relate generally to a substrate treatment device, a substrate treatment method and a semiconductor device manufacturing method.

BACKGROUND

A technique of supplying a metal to a channel semiconductor layer of a semiconductor memory and crystallizing the channel semiconductor layer has been discussed.

Examples of related art include: Zhiguo Meng et al., "Polycrystalline Silicon Films and Thin-Film Transistors Using Solution-Based Metal-Induced Crystallization", Journal of Display Technology, VOL. 2, NO. 3, September 2006 (265-273); and Masakazu Muto et al., "A Noncontact Picolitor Droplet Handling by Photothermal Control of Interfacial Flow", Analytical Sciences, January 2016, VOL. 32.

DETAILED DESCRIPTION

Figure 1:
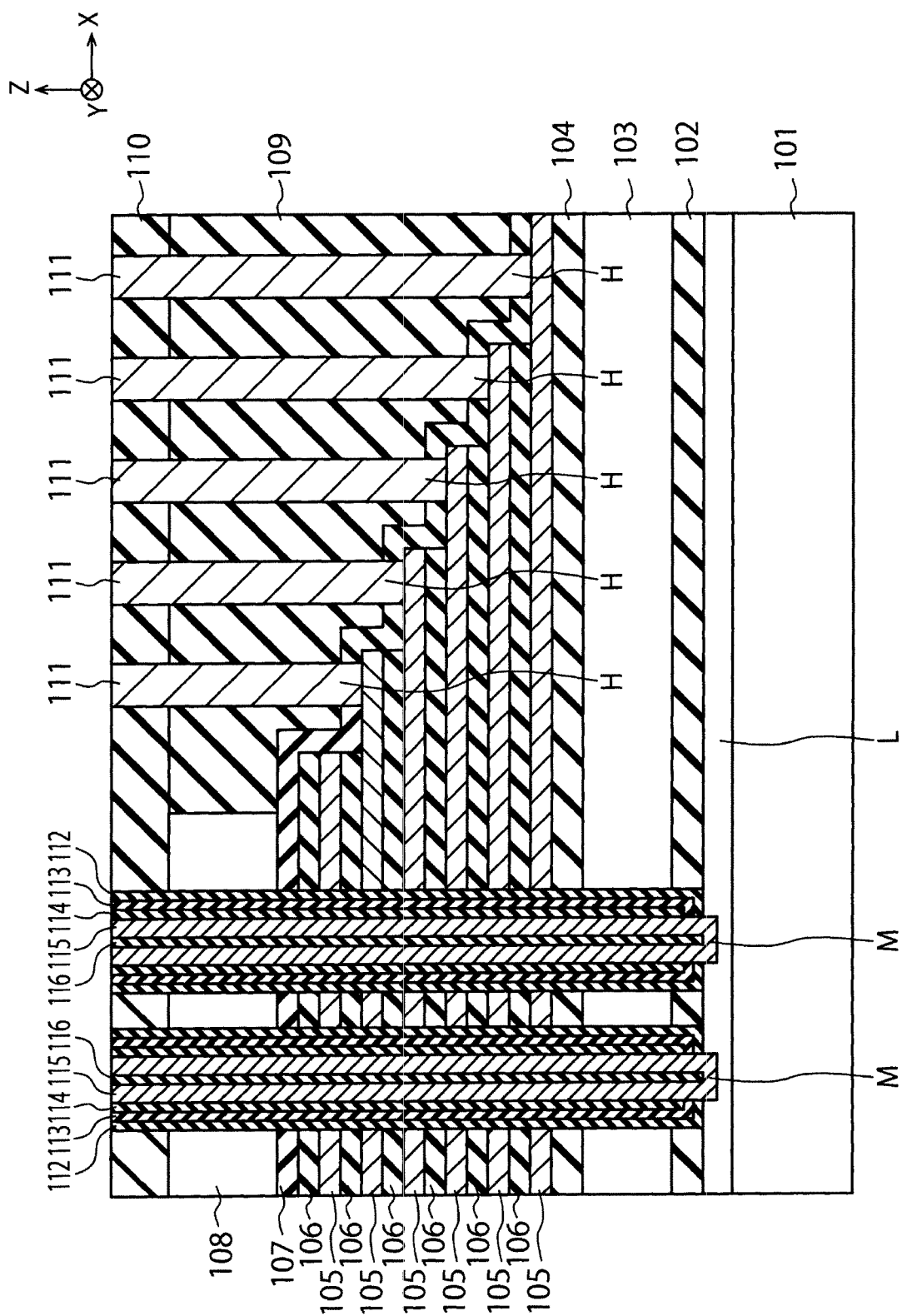
FIG. 1 is a cross-sectional view illustrating a structure of a semiconductor device of a first embodiment.

Embodiments provide a substrate treatment device, a substrate treatment method and a semiconductor device manufacturing method by which metal particles can be appropriately supplied to a substrate.

In general, according to one embodiment, a substrate treatment device includes a dilutor configured to dilute a first liquid containing a metal ion and exhibiting acidity. The device further includes a pH changer configured to change a pH of the first liquid before or after being diluted by the dilutor. The device further includes a substrate conditioner configured to treat a substrate using the first liquid, which is diluted by the dilutor and with the pH changed by the pH changer.

Hereinafter, embodiments will be described with reference to the drawings. In FIGS. 1 to 8, the same or similar components are denoted by the same reference numerals, and the repetitive description thereof will be omitted.

First Embodiment

FIG. 1 is a cross-sectional view illustrating a structure of semiconductor device of a first embodiment. The semiconductor device shown in FIG. 1 includes a three-dimensional semiconductor memory.

The semiconductor device shown in FIG. 1 includes a semiconductor substrate 101, a lower insulation film 102, a source side conductive layer 103, an upper insulation film 104, a plurality of electrode layers 105, a plurality of insulation layers 106, a cover insulation film 107, a drain side conductive layer 108, a first interlayer insulation film 109, a second interlayer insulation film 110, a plurality of contact plugs 111, a block insulation film 112, a charge storage layer 113, a tunnel insulation film 114, a channel semiconductor layer 115 and a core insulation film 116.

The semiconductor substrate 101 is, for example, a silicon (Si) substrate. FIG. 1 shows an X direction and a Y direction, which are perpendicular to each other and parallel with a surface of the semiconductor substrate 101, and a Z direction which is perpendicular to the surface of the semiconductor substrate 101. In this specification, a +Z direction is taken as an upward direction and a −Z direction is taken as a downward direction. The −Z direction may coincide with the gravity direction or may not coincide with the gravity direction.

The lower insulation film 102 is formed on a diffusion layer L formed in the semiconductor substrate 101. The source side conductive layer 103 is formed on the lower insulation film 102. The upper insulation film 104 is formed on the source side conductive layer 103.

The plurality of electrode layers 105 and the plurality of insulation layers 106 are alternately stacked on the upper insulation film 104. The electrode layer 105 is, for example, a metal layer and functions as a word line or a selection line. The number of layers of the electrode layers 105 is, for example, 64 or more. The insulation layer 106 is, for example, a silicon oxide film. The number of layers of the insulation layers 106 is, for example, 64 or more. FIG. 1 shows memory holes M that penetrate the electrode layers 105 and the insulation layers 106, and contact holes H that are formed on staircase regions of the electrode layers 105 and the insulation layers 106.

The cover insulation film 107 is formed on the electrode layers 105 and the insulation layers 106. The drain side conductive layer 108 is formed on the cover insulation film 107 so as to be adjacent to the staircase regions. The first interlayer insulation film 109 is formed on the cover insulation film 107 so as to fill spaces above the staircase regions. The second interlayer insulation film 110 is formed on the drain side conductive layer 108 and the first interlayer insulation film 109.

The plurality of contact plugs 111 are formed in the contact holes H that penetrate the cover insulation film 107, the first interlayer insulation film 109 and the second interlayer insulation film 110. The contact plugs 111 are electrically connected to different electrode layers 105 respectively. Each contact plug 111 is formed of, for example, a barrier metal layer such as titanium (Ti)-containing layer and a plug material layer such as a tungsten (W) layer.

The block insulation film 112, the charge storage layer 113, the tunnel insulation film 114, the channel semiconductor layer 115 and the core insulation film 116 are sequentially formed on a side surface of the memory hole H that penetrates the lower insulation film 102, the source side conductive layer 103, the upper insulation film 104, the electrode layers 105, the insulation layers 106, the cover insulation film 107, the drain side conductive layer 108 and the second interlayer insulation film 110. The block insulation film 112 is, for example, a silicon oxide film. The charge storage layer 113 is, for example, a silicon nitride film and may be a semiconductor layer such as a polysilicon layer. The tunnel insulation film 114 is, for example, a silicon oxide film. The channel semiconductor layer 115 is, for example, a polysilicon layer and is electrically connected to the semiconductor substrate 101. The core insulation film 116 is, for example, a silicon oxide film.

The block insulation film 112, the charge storage layer 113, the tunnel insulation film 114, the channel semiconductor layer 115 and the core insulation film 116 are formed by, for example, the following procedure. First, the block insulation film 112, the charge storage layer 113 and the tunnel insulation film 114 are sequentially formed on the side surface and a bottom surface of the memory hole M. Next, the tunnel insulation film 114, the charge storage layer 113 and the block insulation film 112 are removed from the bottom surface of the memory hole M. Thereafter, the channel semiconductor layer 115 and the core insulation film 116 are sequentially embedded in the memory hole M. The block insulation film 112, the charge storage layer 113, the tunnel insulation film 114 and the channel semiconductor layer 115 are examples of a memory film.

Figure 2A:
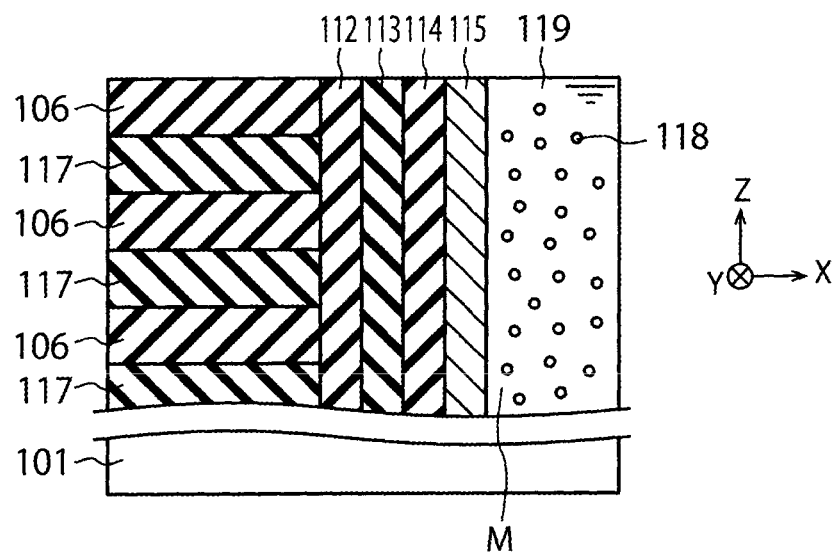
FIGS. 2A and 2B are cross-sectional views illustrating a semiconductor device manufacturing method of the first embodiment.
Figure 2B:
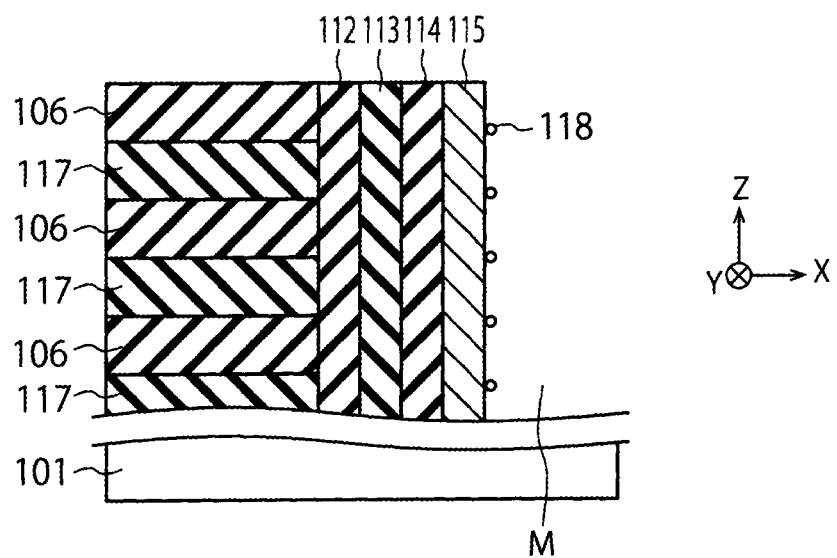

FIGS. 2A and 2B are cross-sectional views illustrating a semiconductor device manufacturing method of the first embodiment.

First, as shown in FIG. 1, the lower insulation film 102, the source side conductive layer 103 and the upper insulation film 104 are sequentially formed on the semiconductor substrate 101. Next, a plurality of sacrificial layers 117 and the plurality of insulation layers 106 are alternately formed on the upper insulation film 104 (FIG. 2A). The sacrificial layer 117 is, for example, a silicon nitride film. The insulation layer 106 is, for example, a silicon oxide film.

The sacrificial layers 117 are replaced with the electrode layers 105 in a subsequent process. It should be noted that when the plurality of electrode layers 105 and the plurality of insulation layers 106 are alternately formed in a process of FIG. 2A, the sacrificial layers 117 do not need to be replaced with the electrode layers 105.

Next, the memory hole M that penetrates the sacrificial layers 117 and the insulation layers 106 and reaches the semiconductor substrate 101 is formed (FIG. 2A). Next, the block insulation film 112, the charge storage layer 113, the tunnel insulation film 114 and the channel semiconductor layer 115 are sequentially formed on side surfaces of the sacrificial layers 117 and the insulation layers 106 in the memory hole M (FIG. 2A).

The channel semiconductor layer 115 in FIG. 2A is, for example, an amorphous silicon layer. The channel semiconductor layer 115 is, for example, formed by employing Low Pressure Chemical Vapor Deposition (LPCVD) at a temperature of 400° C. to 600° C. and a pressure of 1 Pa to 500 Pa. Examples of a source gas of the channel semiconductor layer 115 include a $SiH_4$ gas, a $Si_2H_6$ gas and a Si containing organic gas (Si represents silicon and H represents hydrogen). The amorphous silicon layer is an example of the amorphous layer.

Next, a chemical solution 119 containing metal particles 118 is supplied to the semiconductor substrate 101. As a result, the chemical solution 119 enters the memory hole M (FIG. 2A), and the metal particles 118 in the chemical solution 119 adhere to a side surface of the channel semiconductor layer 115 (FIG. 2B). For example, the metal particles 118 of the present embodiment are from a nickel hydroxide, and contain a plurality of nickel atoms. Thereafter, the semiconductor substrate 101 is rinsed with water and then is dried with a nitrogen gas. A two-dimensional concentration of the metal atoms on the side surface of the channel semiconductor layer 115 in FIG. 2B is, for example, $2.0\times10^{13}$ to $1.0\times10^{16}$ [atoms/cm$^2$].

Next, the channel semiconductor layer 115 and the like are annealed at a temperature of 500° C. to 600° C. and a pressure of 100 Pa to a normal pressure. As a result, the metal particles 118 or the metal atoms contained in the metal particles 118 enter the channel semiconductor layer 115, and the channel semiconductor layer 115 is crystallized. The channel semiconductor layer 115 is crystallized, for example, from an amorphous silicon layer to a polysilicon layer. At this time, a grain size of a crystal grain in the polysilicon layer is increased due to an influence of entry of the metal particles 118 or the metal atoms.

Thereafter, the core insulation film 116 is formed on the side surface of the channel semiconductor layer 115 in the memory hole M. The sacrificial layers 117 are replaced with the electrode layers 105. In this way, at least a portion of the semiconductor device shown in FIG. 1 can be manufactured.

Figure 3:
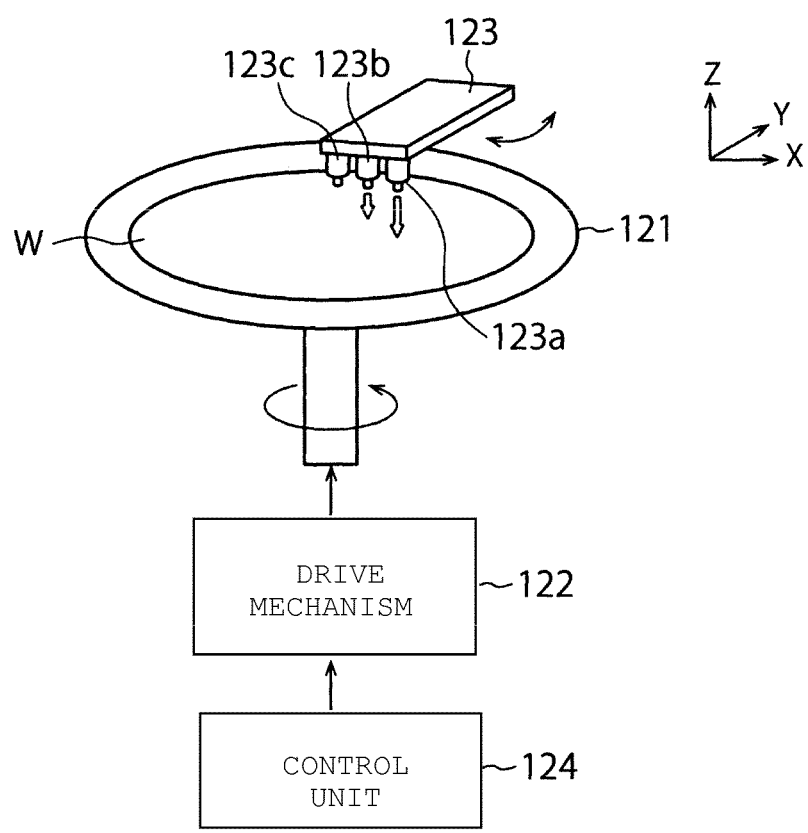
FIG. 3 is a perspective view schematically illustrating the configuration of a device for implementing the semiconductor device manufacturing method of the first embodiment.

FIG. 3 is a perspective view schematically illustrating the configuration of a device for implementing the semiconductor device manufacturing method of the first embodiment.

The device of FIG. 3 includes a table 121, a drive mechanism 122, an arm 123 and a control unit 124. The arm 123 includes a chemical solution nozzle 123a, an alkali nozzle 123b and a water nozzle 123c.

The table 121 is used to support a substrate (wafer) W, and the drive mechanism 122 can rotate the substrate N by driving the table 121. The arm 123 can move the chemical solution nozzle 123a, the alkali nozzle 123b and the water nozzle 123c to an upper side of the substrate W. The control unit 124 controls various operations of the device in FIG. 3, for example, driving of the drive mechanism 122, movements of the arm 123, and discharge operations of the chemical solution nozzle 123a, the alkali nozzle 123b and the water nozzle 123c. The substrate N includes, for example, the semiconductor substrate 101 and various layers provided on the semiconductor substrate 101 shown in FIG. 2A.

The chemical solution nozzle 123a discharges a chemical solution (metal ion aqueous solution) containing metal ions and exhibiting (measurable or detectable) acidity, to the substrate W. The metal, for example, is a transition metal or a rare earth metal, which is ionized under an acidic condition, and forms a hydroxide under an alkaline condition which can be applied on the metal via deposition. Examples of the metal include gold (Au), aluminum (Al), copper (Cu), silver (Ag), lead (Pd), nickel (Ni), platinum (Pt), manganese (Mn), ruthenium (Rh), cobalt (Co), iron (Fe), chromium (Cr), titanium (Ti), niobium (Nb), iridium (Ir) and tantalum (Ta). In some embodiments, nickel (Ni) and Al (aluminum) are used. Examples of the chemical solution include at least one of a sulfuric acid aqueous solution, a nitric acid aqueous solution, a hydrochloric acid aqueous solution, an acetic acid aqueous solution, a formic acid aqueous solution, an oxalic acid aqueous solution, a sulfamic acid aqueous solution or a carbonic acid aqueous solution, each of which contains metal ions. The chemical solution is an example of the first liquid. The chemical solution discharged from the chemical solution nozzle 123a has properties same as that of a chemical solution flowing through a chemical solution flow path 41 (see FIG. 4) to be described below.

The alkali nozzle 123b supplies an alkali to the substrate W, and, for example, discharges an alkali aqueous solution to the substrate W. When the chemical solution from the chemical solution nozzle 123a and the alkali from the alkali nozzle 123b are supplied to the substrate W, a neutralization reaction between the acid and the alkali occurs. Examples of the alkali include an ammonia aqueous solution, a sodium hydroxide aqueous solution, a potassium hydroxide aqueous solution and a calcium hydroxide aqueous solution, and organic amine aqueous solutions such as a tetramethylammonium hydroxide (TMAH) aqueous solution and a choline (trimethyl 2-oxyethyl ammonium hydroxide) aqueous solution. The alkali is an example of a second liquid and is an example of a substance that changes the pH of the first liquid. The alkali aqueous solution supplied from the alkali nozzle 123b has properties same as that of an alkali supplied from an alkali flow path 51 (see FIG. 4) to be described later.

The water nozzle 123c discharges water to the substrate W. The water, for example, is used for rinsing the substrate W.

Hereinafter, operations of the device in FIG. 3 will be described in detail.

First, the drive mechanism 122 starts rotating the substrate N on the table 121. Next, the chemical solution nozzle 123a discharges the chemical solution to the substrate W in rotation. Next, the alkali nozzle 123b discharges the alkali aqueous solution to the substrate W in rotation. As a result, the chemical solution is mixed with the alkali aqueous solution on a surface of the substrate W. As described above, in the present embodiment, the chemical solution and the alkali aqueous solution are sequentially discharged to the substrate W.

In the present embodiment, by mixing the chemical solution with the alkali aqueous solution, the pH of the chemical solution can be changed (raised), and for example, the pH of the chemical solution can be changed from a value less than 7 to a value in a range of 7 to 9. As a result, the metal ions in the chemical solution form a hydroxide. For example, nickel ions $Ni^{2+}$ form nickel hydroxide $Ni(OH)_2$. Accordingly, metal particles that contain metal atoms derived from the metal ions in the form of a metal compound (for example, a metal hydroxide) can be produced. Hereinafter, such a metal compound will be described as "metal particle".

When the chemical solution is mixed with the alkali aqueous solution on the surface of the substrate W, metal particles are produced in the chemical solution, and a state shown in FIG. 2A is achieved. In FIG. 2A, the chemical solution 119 containing the metal particles 118 is supplied to the semiconductor substrate 101. As a result, as described above, the chemical solution 119 enters the memory hole M (FIG. 2A), and the metal particles 118 in the chemical solution 119 adhere to the side surface of the channel semiconductor layer 115 (FIG. 2B). In this way, the semiconductor device shown in FIG. is manufactured.

Here, the alkali aqueous solution may be discharged to the substrate W earlier than the chemical solution. In this case, the alkali nozzle 123b discharges the alkali aqueous solution to the substrate W in rotation, and thereafter the chemical solution nozzle 123a discharges the chemical solution to the substrate W in rotation. As a result, the chemical solution is mixed with the alkali aqueous solution on the surface of the substrate W to manufacture the semiconductor device in FIG. 1.

Timing of discharging the chemical solution and timing of discharging the alkali aqueous solution are controlled by the control unit 124. When the alkali aqueous solution is discharged later than the chemical solution, the control unit 124 may start discharging the alkali aqueous solution after discharge of the chemical solution is finished, or may start discharging the alkali aqueous solution before the discharge of the chemical solution is finished. Similarly, when the alkali aqueous solution is discharged earlier than the chemical solution, the control unit 124 may start discharging the chemical solution after discharge of the alkali aqueous solution is finished, or may start discharging the chemical solution before the discharge of the alkali aqueous solution is finished. The control unit 124 may alternately repeat a plurality of processes of discharging the chemical solution and a plurality of processes of discharging the alkali aqueous solution. Accordingly, the amount of the metal particles supplied onto the substrate W can be increased.

In the present embodiment, although the pH of the chemical solution is increased from a value less than 7 to a value in the range of 7 to 9 (for example, a value around 8), the pH may be raised to other values. However, when the pH of the chemical solution is raised to a value in the range of 7 to 9, for example, crystallization of the amorphous silicon film can be effectively promoted to form a polysilicon film containing crystal grains having a large grain size. The concentration of the metal atoms on a surface of the amorphous silicon film after being treated using the chemical solution is preferred to be $2.0 \times 10^{13}$ to $1.0 \times 10^{16}$ [atoms; $cm^2$], and accordingly the polysilicon film containing crystal grains having a large grain size can be formed. Such a concentration can be achieved, for example, by raising the pH of the chemical solution to a value in the range of 7 to 9. The surface of the amorphous silicon film to be supplied with the chemical solution is, for example, hydrophilic or/and hydrophobic.

On the other hand, in the present embodiment, the alkali nozzle 123b may be replaced with an acid nozzle and the acid may be supplied from the acid nozzle to the substrate W. On the surface of the substrate W, the chemical solution is mixed with an acid such as carbonated water instead of being mixed with an alkali such as an ammonia aqueous solution. According to an experiment, even when the chemical solution is mixed with carbonated water, the state shown in FIG. 2A can be achieved and the semiconductor device shown in FIG. 1 can be manufactured. When the chemical solution is mixed with the carbonated water, the metal ion in the chemical solution is combined with a carbonate ion. For example, the nickel ion $Ni^{2+}$ changes into nickel carbonate $NiCO_3$. Timing of discharging the carbonated water can be controlled in the same manner as the timing of discharging the alkali aqueous solution is controlled.

In this case, the acid is supplied to the substrate W after the chemical solution is supplied to the substrate W. Accordingly, nickel carbonate $NiCO_3$ or basic nickel carbonate $NiCO.2Ni(3OH)_2.4H_2O$ is formed on the substrate W.

When supplying the carbonated water to the surface of the substrate W, the carbonated water may be discharged to the surface of the substrate W, and the carbonated water may be supplied to the surface of the substrate W by discharging a carbon dioxide gas and water onto the surface of the substrate W and dissolving the carbon dioxide gas in the water on the surface of the substrate W. Similarly, when supplying the mixed solution to the surface of the substrate W, the mixed solution may be supplied to the surface of the substrate W by discharging the carbon dioxide gas and a nickel sulfate aqueous solution onto the surface of the substrate W and dissolving the carbon dioxide gas in the nickel sulfate aqueous solution on the surface of the substrate W.

Instead of mixing the chemical solution with the alkali aqueous solution, for example, an ammonia gas may be supplied to the surface of the chemical solution. Accordingly, metal contamination of the device and tubes thereof can be prevented.

As described above, the device in FIG. 3 mixes the chemical solution with an alkali or an acid on the surface of the substrate W to produce the metal particles in the chemical solution, and supplies the metal particles to the substrate W. However, in the present embodiment, the chemical solution may be mixed with an alkali or an acid in advance to produce the metal particles in the chemical solution, and the chemical solution is supplied to the substrate W so as to supply the metal particles to the substrate W. When this method is adopted, variation in particle size of the metal particles can be prevented, but there may be a problem that the tubes for carrying the chemical solution are contaminated. In the present embodiment, for example, this problem can be addressed by adopting the substrate treatment device in FIG. 4.

Figure 4:
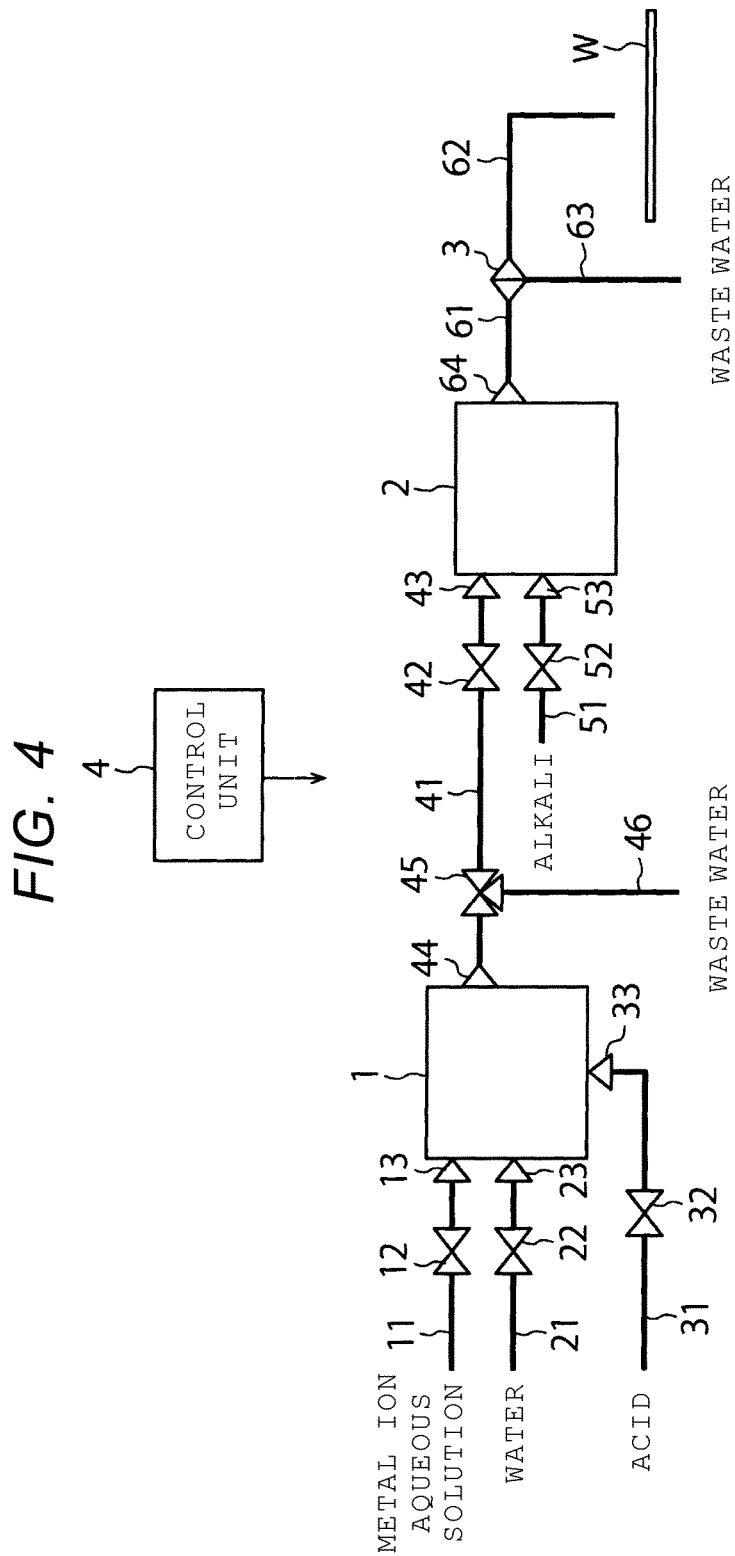
FIG. 4 is a diagram schematically illustrating the configuration of another substrate treatment device of the first embodiment.

FIG. 4 is a diagram schematically illustrating the configuration of the substrate treatment device of the first embodiment.

The substrate treatment device in FIG. 4 includes a mixing box 1, a mixing box 2, a separation mechanism 3 and a control unit 4. The mixing box 1 is an example of the dilution unit (or dilutor). The mixing box 2 and the separation mechanism 3 are examples of a potential Hydrogen (pH) change unit (or pH changer). Each of the mixing boxes 1 and 2 includes, for example, a valve referred to as a mixing valve. The tube (equivalent to each flow path to be described below) that is provided with a flow rate control system and a valve and that has a size about ¼ of that of the mixing valve is inserted in the mixing valve. Accordingly, each of the mixing boxes 1 and 2 can join a certain liquid and another liquid together. A joint point of these liquids is not limited to a valve such as the mixing valve, and may be a tank.

The substrate treatment device in FIG. 4 further includes: a chemical solution flow path 11, and a valve 12 and a check valve 13 that are provided along the chemical solution flow path 11; a water flow path 21, and a valve 22 and a check valve 23 that are provided along the water flow path 21; an acid flow path 31, and a valve 32 and a check valve 33 that are provided along the acid flow path 31; a chemical solution flow path 41, and a valve 42, a check valve 43, a check valve 44 and a three-way valve 45 that are provided along the chemical solution flow path 41; a branch flow path 46; an alkali flow path 51, and a valve 52 and a check valve 53 that are provided along the alkali flow path 51; a chemical solution flow path 61, and a check valve 64 that is provided along the chemical solution flow path 61; a branch flow path 62; and a branch flow path 63. The chemical solution flow path 61, the branch flow path 62, the branch flow path 63 and the check valve 64 are examples of the substrate treatment unit (or substrate conditioner).

In the following description, the chemical solution flow path 11, for example, is provided with upstream of the mixing box 1, or referred to as an upstream flow path of the mixing box 1. The chemical solution flow paths 41 and 61, for example, are provided with downstream of the mixing box 1, or referred to as downstream flow paths of the mixing box 1. The chemical solution flow path 61, for example, is provided with downstream of the mixing box 2, or referred to as a downstream flow path of the mixing box 2

The chemical solution flow path 11 supplies a chemical solution (metal ion aqueous solution), which contains metal ions at a high concentration and exhibits acidity, to the mixing box 1. The metal, for example, is a transition metal or a rare earth metal, is ionized under an acidic condition, and forms a hydroxide under an alkaline condition which is deposited. Examples of the metal include Au, Al, Cu, Ag, Pd, Ni, Pt, Mn, Rh, Co, Fe, Cr, Ti, Nb, Ir, and Ta, and Ni or Al is preferred. Examples of the chemical solution include at least one of a sulfuric acid aqueous solution, a nitric acid aqueous solution, a hydrochloric acid aqueous solution, an acetic acid aqueous solution, a formic acid aqueous solution, an oxalic acid aqueous solution, a sulfamic acid aqueous solution or a carbonic acid aqueous solution, each of which contains metal ions. The chemical solution is an example of the first liquid. The chemical solution may further contain metal particles containing a plurality of metal atoms in the form of, for example, a metal compound. The chemical solution exhibits acidity of pH less than 7 to keep the metal in an ionized state.

The water flow path 21 supplies a diluent such as water to the mixing box 1. The diluent may be a liquid other than water.

The acid flow path 31 supplies an acid to the mixing box 1. The acid, for example, is an acid constituting a metal ion aqueous solution. Examples of the acid include a sulfuric acid aqueous solution and a nitric acid aqueous solution. Since the acid also functions as a cleaning liquid of the metal compound, in some embodiments, the acid may have a pH lower than that of the chemical solution. The pH of the acid, for example, is about 1 or less.

The chemical solution flow path 11, the water flow path 21 and the acid flow path 31 are defined by the tubes (a pipe or a tube) made from, for example, a fluorine-based resin or a Teflon material.

The mixing box 1 includes a chemical solution nozzle provided in the chemical solution flow path 11 and a water nozzle provided in the water flow path 21. A chemical solution from the chemical solution nozzle is mixed with water from the water nozzle. The chemical solution can be diluted by mixing the chemical solution and the water in the mixing box 1. The mixing box 1 further includes an acid nozzle provided in the acid flow path 31. The metal particles can be ionized by stopping supply of the chemical solution to the downstream flow path of the mixing box 1 and supplying the acid from the acid nozzle. The chemical solution mixed with the water is discharged from the mixing box 1 to the chemical solution flow path 41. Specifically, the chemical solution is discharged by pressure-feeding under valve control with pump pressure or $N_2$ pressurization. As such, the flow rate of the chemical solution is measured with an ultrasonic flowmeter, and is controlled by a regulator.

The chemical solution, which is discharged from the mixing box 1, contains the metal ions and exhibits acidity, is supplied to the mixing box 2 through the chemical solution flow path 41. Since the chemical solution is diluted with water in the mixing box 1 of the present embodiment, a concentration of the metal ions in the chemical solution flowing through the chemical solution flow path 41 is lower than a concentration of the metal ions in the chemical solution flowing through the chemical solution flow path 11.

An alkali is supplied to the mixing box 2 through the alkali flow path 51. Accordingly, a neutralization reaction between the acid and the alkali occurs. Examples of the alkali include at least one of an ammonia aqueous solution, a sodium hydroxide aqueous solution, a potassium hydroxide aqueous solution, a calcium hydroxide aqueous solution, or organic amine aqueous solutions such as a TMAH aqueous solution and a choline aqueous solution. The alkali is an example of the second liquid and is an example of a substance that changes the pH of the first liquid.

A liquid (usually a chemical solution) flowing through the chemical solution flow path 41 passes through the three-way valve 45 so as to be supplied to the mixing box 2. However, when the liquid flowing through the chemical solution flow path 41 is discharged as waste water, the liquid is discharged from the three-way valve 45 to the branch flow path 46.

The mixing box 2 includes a chemical solution nozzle provided in the chemical solution flow path 41 and an alkali nozzle provided in the alkali flow path 51. A chemical solution from the chemical solution nozzle and an alkali from the alkali nozzle are mixed. In the mixing box 2, by mixing the chemical solution with the alkali, the pH of the chemical solution can be changed (raised), and for example, the pH of the chemical solution can be changed from a value less than 7 to a value in the range of 7 to 9. As a result, the metal ions in the chemical solution form a hydroxide. For example, nickel ions $Ni^{2+}$ form nickel hydroxide $Ni(OH)_2$. Accordingly, metal particles that contain metal atoms derived from the metal ions in the form of a metal compound (for example, a metal hydroxide) can be produced. The chemical solution mixed with the alkali is discharged from the mixing box 2 to the chemical solution flow path 61. Hereinafter, such a metal compound will be described as "metal particle".

The chemical solution, which is discharged from the mixing box 2 and contains metal particles, is supplied to the separation mechanism 3 through the chemical solution flow path 61. Since the pH of the chemical solution is changed from a value less than 7 to a value around 8 in the mixing box 2 of the present embodiment, the chemical solution flowing through the chemical solution flow path 61 exhibits alkalinity.

The separation mechanism 3 removes metal particles having a particle size outside a predetermined range from the chemical solution, and leaves metal particles having a particle size within a predetermined range in the chemical solution. The separation mechanism 3 of the present embodiment, by filtering the chemical solution with a filtration membrane in the separation mechanism 3, removes metal particles having a particle size larger than a fixed value from the chemical solution, and leaves metal particles having a particle size of the fixed value or less in the chemical solution. As a result, the separation mechanism 3 discharges a chemical solution in which the metal particles having a particle size larger than the fixed value, are removed and the metal particles having a particle size of the fixed value or less remain to the branch flow path 62. On the other hand, the branch flow path 63 is used to discharge waste water generated at the separation mechanism 3.

When metal particles having a large particle size are accumulated in the separation mechanism 3, the separation mechanism 3 may be clogged. Therefore, in order to remove the metal particles having a large particle size and accumulated in the separation mechanism 3, the acid is supplied to the separation mechanism 3 so that the metal particles can be ionized again. The liquid in the separation mechanism 3 can be neutralized by supplying water after the supply of the acid. Accordingly, the accumulated metal particles can be discharged. The branch flow path 63 is used to discharge the liquid as waste water (filter cleaning).

The chemical solution discharged to the branch flow path 62 is discharged from the chemical solution nozzle provided in the branch flow path 62 to the substrate (wafer) W. Accordingly, the substrate W can be treated with the chemical solution, and specifically, the metal particles in the chemical solution can be applied to the substrate W.

The substrate W of the present embodiment includes, for example, a silicon substrate and an amorphous silicon film formed on the silicon substrate. The amorphous silicon film is crystallized by using the metal particles in the chemical solution. Specifically, the metal particles in the chemical solution are adhered to the surface (surface of the amorphous silicon film) of the substrate W, and thereafter, the substrate W is annealed, so that the crystallization of the amorphous silicon film can be promoted by the metal atoms in the metal particles. In this case, a concentration of the metal atoms on the surface of the substrate W after being treated using the chemical solution is preferred to be $2.0\times10^{13}$ to $1.0\times10^{16}$ [atoms/cm$^2$]. The metal particles and the chemical solution are equivalent to, for example, the metal particles 118 and the chemical solution 119 that are shown in FIG. 2A. The substrate W includes, for example, the semiconductor substrate 101 and various layers provided on the semiconductor substrate 101 shown in FIG. 2A.

The control unit 4 controls various operations of the substrate treatment device. Examples of the control unit 4 include a processor, an electrical circuit and a computer. The control unit 4 controls, for example, operations of the mixing box 1, the mixing box 2 and the separation mechanism 3, opening and closing as well as opening degrees of the valves 12, 22, 32, 42 and 52, opening and closing as well as opening degrees of the check valves 13, 23, 33, 43, 44, 53 and 64, and opening and closing as well as an opening degree of the three-way valve 45.

According to the present embodiment, metal contamination of the substrate treatment device can be prevented, and metal particles having a uniform particle size can be applied to the substrate W. Hereinafter, prevention of the metal contamination and the particle size of the metal particles will be described in detail.

In FIG. 4, the chemical solution (metal ion aqueous solution) flowing through the chemical solution flow path 11 contains the metal ions at a high concentration and exhibits acidity. The metal ions in the chemical solution may adhere to inner walls of tubes constituting the chemical solution flow path 11, and accordingly the concentration of the metal ions in the chemical solution fluctuates. Here, the higher the concentration of the metal ions in the chemical solution is, the less likely the chemical solution is to be affected by fluctuation of the concentration of the metal ions due to adhesion of metal ions or the like. Therefore, in some embodiments, the concentration of the metal ions in the chemical solution flowing in the chemical solution flow path 11 may be as high as possible.

On the other hand, the metal ions in the acidic chemical solution are less likely to adhere to inner walls of tubes made from resin or Teflon, but the metal particles are likely to adhere to such inner walls of the tubes. Since the metal of the present embodiment is easier to be ionized as the pH of the chemical solution becomes lower, the pH of the chemical solution in the chemical solution flow path 11 is preferred to be lower. This will be described with reference to FIG. 5.

Figure 5:
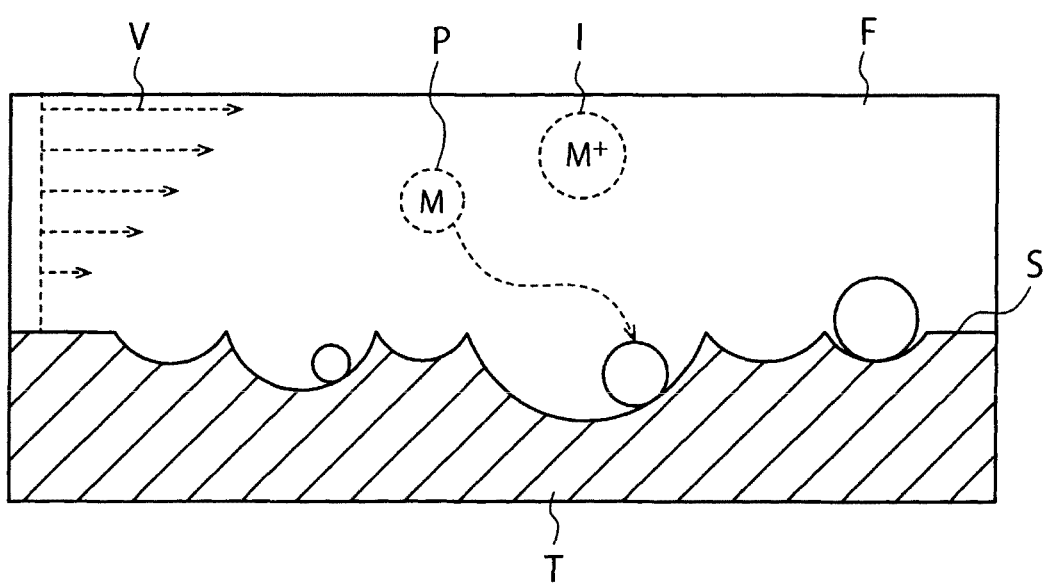
FIG. 5 is a diagram schematically illustrating metal particles of the first embodiment.

FIG. 5 is a diagram schematically illustrating the metal particles of the first embodiment.

FIG. 5 shows a part of tube T constituting the chemical solution flow path 11, a surface S of an inner wall of the tube T, a chemical solution F flowing through the tube T, and distribution of flow velocity V of the chemical solution F. A symbol I denotes a metal ion in the chemical solution F, and a symbol P denotes a metal particle in the chemical solution F.

As shown in FIG. 5, when the metal particle P carried by the chemical solution F reaches the surface S of the tube T, the metal particle P is trapped in a concave portion of the surface S, and is adsorbed on the surface S by van der Waals force or electrostatic force. On the other hand, the metal ion I is less likely to be adsorbed on the surface S of the tube T. Once the metal particle P is adsorbed on the surface S, it is difficult to detach the metal particle P from the surface S with the flow of the chemical solution F. When the metal particle P is adsorbed on the surface S, a concentration of metal atoms in the chemical solution F is decreased, and the concentration of the metal atoms in the chemical solution when the chemical solution F is discharged to the substrate W fluctuates. The tube T constituting the chemical solution flow path 11 is a tube of the upstream flow path of the mixing box 1, and it is difficult to clean the tube T.

Therefore, the chemical solution flow path 11 of the present embodiment carries an acidic chemical solution that contains the metal ions at a high concentration and whose pH is far lower than 7 (FIG. 4). Accordingly, the metal is in an ionized state in the chemical solution flow path 11, and the metal particles can be prevented from being adsorbed in the chemical solution flow path 11. Accordingly, the contamination of the chemical solution flow path 11 by the metal particles can be prevented.

In the mixing box 1, the chemical solution from the chemical solution flow path 11 is diluted with water and is discharged to the chemical solution flow path 41. Therefore, the metal particles generated by rise of the pH due to dilution may be adsorbed in the chemical solution flow path 41. Therefore, in the mixing box 1 of the present embodiment, acid cleaning of the chemical solution flow path 41 is performed by discharging an acid from the acid flow path 31 to the chemical solution flow path 41. Since it is difficult to remove the metal particles adsorbed on the surface S of the tube T with the fluid, an acid passes through the tube T as described above so as to remove the metal particles. Accordingly, the metal particles can be dissolved in the acid as metal ions, and the metal ions can be discharged to the outside.

On the other hand, when the chemical solution containing the metal ions is supplied from the chemical solution flow path 41, the chemical solution is mixed with an alkali from the alkali flow path 51 in the mixing box 2 and the chemical solution is changed from being acidic to being alkaline. Accordingly, the metal ions are changed into metal hydroxides, and deposited as metal particles containing the metal hydroxides.

The substrate treatment device of the present embodiment includes a mixing box (mixing box 1) in which the chemical solution is diluted with water and a mixing box (mixing box 2) in which the chemical solution is mixed with an alkali, separately. Advantages of such a configuration will be described with reference to FIG. 6.

Figure 6:
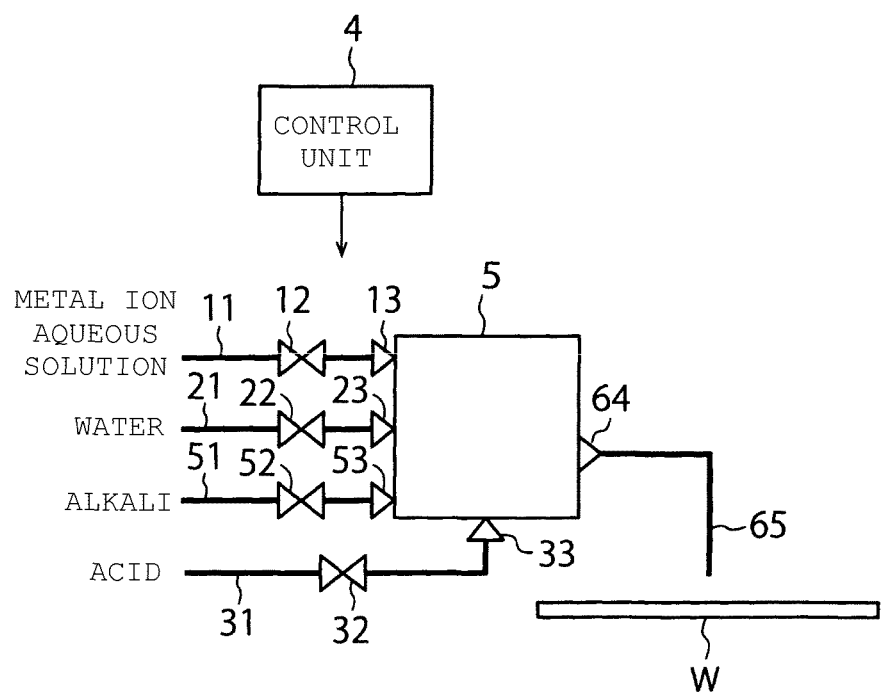
FIG. 6 is a diagram schematically illustrating the configuration of a substrate treatment device of a comparative example of the first embodiment.

FIG. 6 is a diagram schematically illustrating the configuration of a substrate treatment device of a comparative example of the first embodiment.

The substrate treatment device of FIG. 6 does not include the mixing box 1, the mixing box 2, the separation mechanism 3, the chemical solution flow path 41, the valve 42, the check valve 43, the check valve 44, the chemical solution flow path 61, the branch flow path 62 and the branch flow path 63, but instead includes a mixing box 5 and a chemical solution flow path 65.

In the mixing box 5, a chemical solution is supplied from the chemical solution flow path 11, is diluted with water from the water flow path 21, and is mixed with an alkali from the alkali flow path 51. Thereafter, the chemical solution is discharged from the mixing box 5 to the chemical solution flow path 65, and is discharged to the substrate W.

Here, in the present embodiment (FIG. 4), for example, the concentration of the metal ions in the chemical solution flowing through the chemical solution flow path 11 is several tens of parts per hundred, and the concentration of the metal ions in the chemical solution flowing through the chemical solution flow path 41 is several parts per million, and therefore, the chemical solution is diluted with a large amount of water in the mixing box 1. In this case, in order to change the chemical solution from being acidic to being alkaline in the mixing box 2, a large amount of alkali aqueous solution is required. It is difficult to handle such large amounts of water and alkali aqueous solution in one mixing box 5 as shown in the comparative example (FIG. 6). Further, in the substrate treatment device of FIG. 6, since a large amount of aqueous solution (flow rate) is required at one time to dilute the chemical solution, the cost is high and the environmental impact is huge. On the other hand, according to the substrate treatment device of the present embodiment, the flow rate of the aqueous solution can be reduced, and the cost and the environmental impact can be reduced.

Therefore, the substrate treatment device of the present embodiment includes a mixing box (mixing box 1) in which the chemical solution is diluted with water and a mixing box (mixing box 2) in which the chemical solution is mixed with an alkali, separately (FIG. 4). Accordingly, the large amounts of water and alkali aqueous solution can be easily handled. In order to quickly supply the chemical solution from the mixing box 2 to the substrate W after the chemical solution is mixed with the alkali in the mixing box 2, a distance from a chemical solution discharge port of the mixing box 2 to the chemical solution nozzle of the branch flow path 62 is set to be short.

When a plurality of substrates W are treated sequentially, the substrate treatment device of the present embodiment can efficiently perform acid cleaning on the downstream flow path of the mixing box 1 each time a single substrate W is treated. In the present embodiment, since the chemical solution flow path 11 upstream of the mixing box 1 is not likely to be contaminated, the acid cleaning can be omitted. On the other hand, since the chemical solution is diluted in the mixing box 1 and the pH of the chemical solution is raised, the chemical solution flow path 41 downstream of the mixing box 1 is likely to be contaminated, which may thus be followed by an acid cleaning process. Since the metal particles are generated in the mixing box 2, the chemical solution flow path 61 and the branch flow path 62 that are downstream of the mixing box 2 are more likely to be contaminated, which may thus be followed by an acid cleaning process. According to the present embodiment, any one of the chemical solution flow path 41, the chemical solution flow path 61 and the branch flow path 62 can be cleaned by supplying an acid for acid cleaning from the mixing box 1 thereto. Thereafter, by supplying water in the water flow path 21 from the mixing box 1, any one of the chemical solution flow path 41, the chemical solution flow path 61 and the branch flow path 62 can be rinsed with water.

In this way, conditions of the downstream flow path of the mixing box 1 can be adjusted.

The separation mechanism 3 of the present embodiment applies metal particles having a desired particle size to the substrate W. The separation mechanism 3 of the present embodiment includes a filtration membrane, made from Teflon, nylon or resin, as a filtration membrane that filters the chemical solution. Accordingly, the particle size of the metal particles to be supplied to the substrate W can be controlled to be the fixed value or less. That is, according to the present embodiment, uniformity of the particle size of the metal particles contained in the chemical solution after the chemical solution passes through the separation mechanism 3 can be improved as compared with that of the particle size of the metal particles in the chemical solution before the chemical solution passes through the separation mechanism 3.

When the filtration membrane is used to control the particle size in the separation mechanism 3, increasing a surface area of the filtration membrane can prevent pressure loss in the filtration membrane. As a result, volume of the separation mechanism 3 may be increased, and the distance from the chemical solution discharge port of the mixing box 2 to the chemical solution nozzle of the branch flow path 62 may be lengthened. When the distance is desired to be shortened, for example, a method of an embodiment to be described below may be adopted.

As described above, the substrate treatment device of the present embodiment includes the mixing box 1 in which the chemical solution containing the metal ions and exhibiting acidity is diluted with water, and the mixing box 2 in which the pH of the diluted chemical solution is raised with the alkali to generate the metal particles; and treats the substrate W by using the chemical solution containing the metal particles.

Therefore, according to the present embodiment, by carrying the chemical solution containing the metal ions and exhibiting acidity through the upstream flow path of the mixing box 1, for example, metal contamination of the upstream flow path of the mixing box 1 can be prevented. In the mixing box 1, by diluting the chemical solution with water, the chemical solution can be brought into a state more suitable for treating the substrate W.

According to the present embodiment, by mixing the chemical solution with the alkali in the mixing box 2 which is different from the mixing box 1, for example, the chemical solution mixed with the alkali can be quickly supplied to the substrate W. Accordingly, the uniformity of the particle size of the metal particles in the chemical solution can be improved, and the metal contamination of the substrate treatment device can be prevented. According to the present embodiment, the separation mechanism 3 is provided between the mixing box 2 and the substrate W, so that the uniformity of the particle size of the metal particles in the chemical solution can be further improved.

As described above, according to the present embodiment, a substrate treatment device that is capable of appropriately supplying metal particles to the substrate W can be provided.

In the mixing box 2 of the present embodiment, although the pH of the chemical solution is raised from a value less than 7 to a value in the range of 7 to 9 (for example, a value around 8), the pH of the chemical solution may be raised to other values. However, when the pH of the chemical solution is raised to a value in the range of 7 to 9, for example, crystallization of the amorphous silicon film can be effectively promoted to form a polysilicon film containing crystal grains having a large grain size. The concentration of the metal atoms on a surface of the amorphous silicon film after being treated using the chemical solution is preferred to be $2.0 \times 10^{13}$ to $1.0 \times 10^{16}$ [atoms/cm$^2$], and accordingly the polysilicon film containing the crystal grains having a large grain size can be formed. Such a concentration can be achieved, for example, by raising the pH of the chemical solution to a value in the range of 7 to 9. The surface of the amorphous silicon film to be supplied with the chemical solution is, for example, hydrophilic or/and hydrophobic.

On the other hand, in the mixing box 2, the chemical solution may be mixed with an acid such as carbonated water instead of being mixed with an alkali such as an ammonia aqueous solution. In this case, the pH of the chemical solution in the mixing box 2 is lowered. According to the experiment, even when the chemical solution is mixed with the carbonated water in the mixing box 2, the uniformity of the particle size of the metal particles in the chemical solution can still be improved and the metal contamination of the substrate treatment device can still be prevented. When the chemical solution is mixed with the carbonated water, the metal ion in the chemical solution is combined with a carbonate ion. For example, the nickel ion $Ni^{2+}$ changes into nickel carbonate $NiCO_3$. The use of the carbonated water in the mixing box 2 has an advantage that silicon constituting a semiconductor substrate, a channel semiconductor layer or the like can be prevented from being etched in the mixing box 2.

Instead of mixing the chemical solution with the alkali aqueous solution, for example, an ammonia gas may be supplied to the surface of the chemical solution. Accordingly, metal contamination of the substrate treatment device and the tubes thereof can be prevented.

In the present embodiment, instead of providing the mixing box 2 downstream of the mixing box 1, the mixing box 2 may be disposed upstream of the mixing box 1. In this case, a desired pH is maintained in the mixing box 2, and thereafter the chemical solution is diluted with water in the mixing box 1 and the metal particles having a desired concentration is discharged to the separation mechanism 3. According to the experiment, even when the mixing box 2 is disposed upstream of the mixing box 1, the substrate W can still be appropriately treated in the same manner as in the case where the mixing box 2 is disposed downstream of the mixing box 1. The same effect can be obtained by moving an inflow destination of the chemical solution flow path 11 to the mixing box 2 and moving the inflow destination of the alkali flow path 51 to the mixing box 1, without changing the arrangement of the mixing boxes 1 and 2.

The substrate W of the present embodiment may be treated by the substrate treatment device in FIG. 4 or may be treated by the device in FIG. 3. The chemical solution is mixed with an alkali (or an acid) on the surface of the substrate W in the device of FIG. 3, whereas a chemical solution that is already mixed with an alkali (or an acid) is supplied to the substrate W in the substrate treatment device of FIG. 4. When the chemical solution that is already mixed with the alkali is supplied to the substrate W, the variation in the particle size of the metal particles can be further prevented, but the tube for carrying the chemical solution may be contaminated. However, according to the present embodiment, by adopting the substrate treatment device in FIG. 4, such metal contamination can be prevented even when the chemical solution that is already mixed with the alkali is supplied to the substrate W.

As described above, according to the present embodiment, the metal particles can be appropriately supplied to the substrate W by adopting the substrate treatment device in FIG. 4 or the device in FIG. 3.

Second Embodiment

Figure 7:
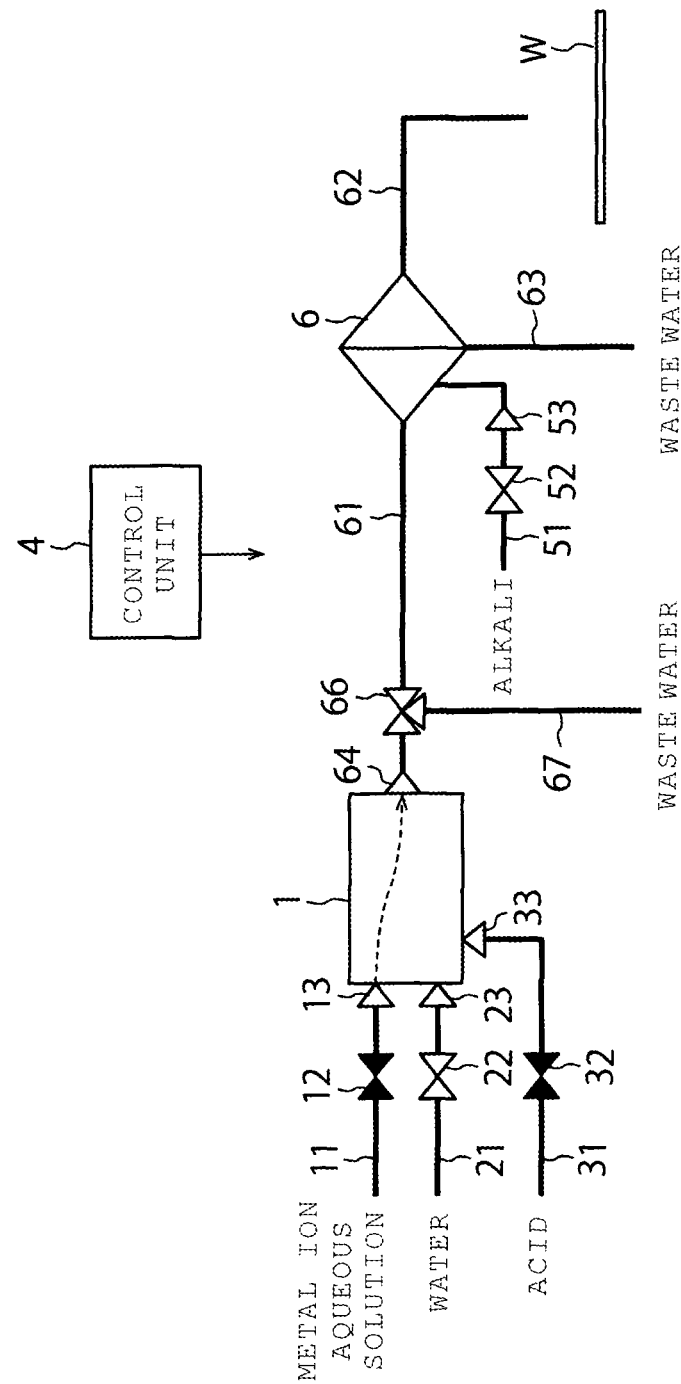
FIG. 7 is a diagram schematically illustrating the configuration of a substrate treatment device of a second embodiment.

FIG. 7 is a diagram schematically illustrating the configuration of a substrate treatment device of a second embodiment.

The substrate treatment device in FIG. 7 does not include the mixing box 2, the separation mechanism 3, the chemical solution flow path 41, the valve 42, the check valve 43, the check valve 44, the three-way valve 45 and the branch flow path 46, but instead includes an ion exchange membrane 6, a three-way valve 66 and a branch flow path 67. The ion exchange membrane 6 is an example of a pH change unit. The ion exchange membrane 6 is disposed at a position same as the separation mechanism 3 in FIG. 4.

The chemical solution containing the metal ions and exhibiting acidity is diluted with water in the mixing box 1. The diluted chemical solution is discharged from the mixing box 1 of the present embodiment to the chemical solution flow path 61, and is supplied to the ion exchange membrane 6 through the chemical solution flow path 61.

The liquid (usually a chemical solution) flowing through the chemical solution flow path 61 passes through the three-way valve 66 so as to be supplied to the ion exchange membrane 6. However, when the liquid flowing through the chemical solution flow path 61 is discharged as waste water, the liquid is discharged from the three-way valve 66 to the branch flow path 67.

The ion exchange membrane 6 has a function of trapping a predetermined ion in the chemical solution and releasing other ions to the chemical solution. The ion exchange membrane 6 of the present embodiment is an anionic anion exchange membrane that traps anions (for example, nitrate ions and sulfate ions) in the chemical solution and releases hydroxide ions (OH$^-$) to the chemical solution.

Therefore, in the substrate treatment device of the present embodiment, by treating the chemical solution with the ion exchange membrane 6, the pH of the chemical solution can be changed (raised), and for example, the pH of the chemical solution can be changed from a value less than 7 to a value in the range of 7 to 9. As a result, the metal ions in the chemical solution form hydroxides. Accordingly, the metal particles containing metal atoms derived from the metal ions can be produced. The chemical solution treated with the ion exchange membrane 6, that is, the chemical solution passed through the ion exchange membrane 6, is discharged to the branch flow path 62. On the other hand, the branch flow path 63 is used to discharge waste water generated at the ion exchange membrane 6.

In the present embodiment, when the chemical solution passes through the ion exchange membrane 6, by releasing the hydroxide ions into the chemical solution, a neutralization reaction occurs in the chemical solution. The pH of the chemical solution after passing through the ion exchange membrane 6 is determined, for example, in accordance with a membrane area of the ion exchange membrane 6.

The ion exchange membrane 6 of the present embodiment also functions as a filtration membrane, similar to the separation mechanism 3 of the first embodiment. Therefore, when the chemical solution passes through the ion exchange membrane 6, metal particles having a particle size larger than a fixed value are removed from the chemical solution, and metal particles having a particle size of the fixed value or less are left in the chemical solution. Such a chemical solution is discharged to the branch flow path 62.

An alkali aqueous solution is supplied to the ion exchange membrane 6 through the alkali flow path 51 of the present embodiment. Accordingly, ion exchange groups of the ion exchange membrane 6 can be recovered, and specifically, hydroxide ions can be reattached to the ion exchange groups. The alkali aqueous solution is, for example, an ammonia aqueous solution or a choline aqueous solution. The alkali flow path 51, the valve 52, and the check valve 53 are examples of a recovery unit (or recovery component). In the substrate treatment device of the present embodiment, a downstream flow path of the mixing box 1 is cleaned with an acid from the acid flow path 31, and thereafter the downstream flow path of the mixing box 1 is rinsed with water from the water flow path 21, and thereafter the alkali aqueous solution from the alkali flow path 51 is supplied to the ion exchange membrane 6.

According to the present embodiment, similar to the first embodiment, a substrate treatment device that is capable of appropriately supplying metal particles to the substrate W can be provided.

Third Embodiment

Figure 8:
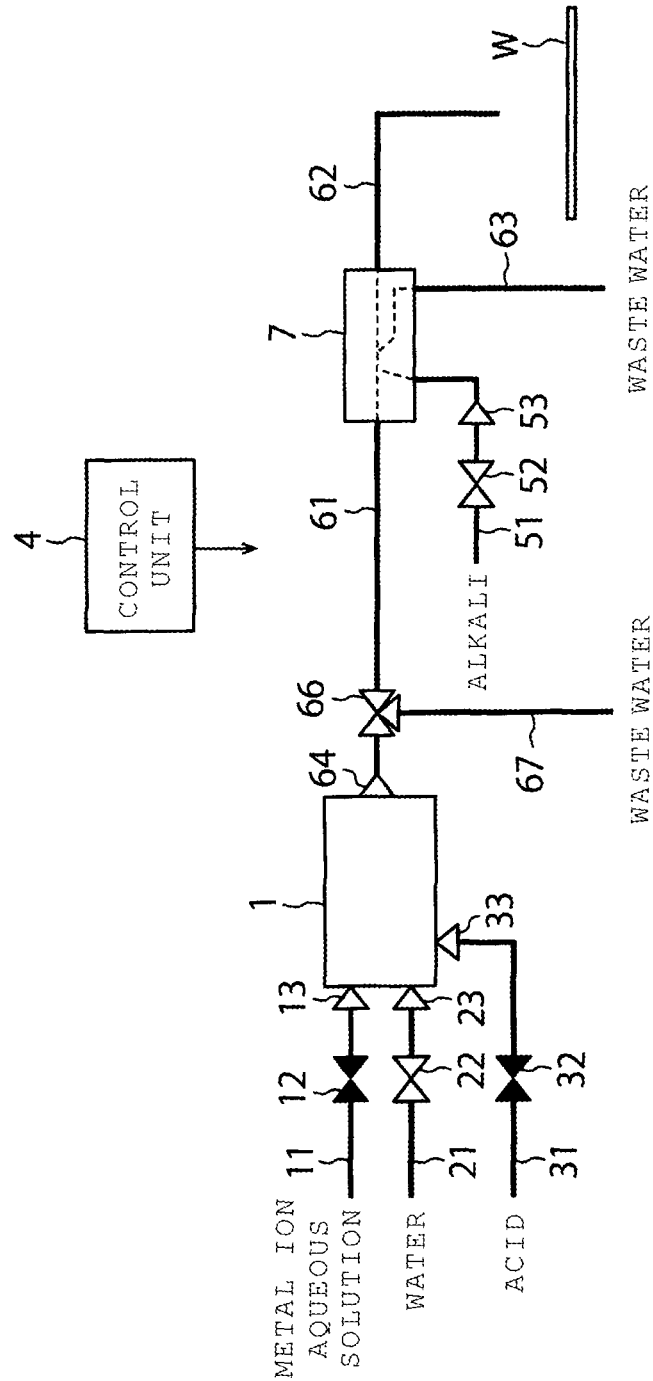
FIG. 8 is a diagram schematically illustrating the configuration of a substrate treatment device of a third embodiment.

FIG. 8 is a diagram schematically illustrating the configuration of a substrate treatment device of a third embodiment.

The substrate treatment device in FIG. 8 does not include the mixing box 2, the separation mechanism 3, the chemical solution flow path 41, the valve 42, the check valve 43, the check valve 44, the three-way valve 45 and the branch flow path 46, but instead includes a separation mechanism 7, the three-way valve 66 and the branch flow path 67. The separation mechanism 7 is an example of a pH change unit. The separation mechanism 7 is disposed at a position same as that of the separation mechanism 4 in FIG. 4 and that of the ion exchange membrane 6 in FIG. 7.

As described above, a chemical solution containing metal ions and exhibiting acidity is diluted with water in the mixing box 1. The diluted chemical solution is discharged from the mixing box 1 of the present embodiment to the chemical solution flow path 61, and is supplied to the separation mechanism 7 through the chemical solution flow path 61.

A liquid (usually a chemical solution) flowing through the chemical solution flow path 61 passes through the three-way valve 66 so as to be supplied to the separation mechanism 7. However, when the liquid flowing through the chemical solution flow path 61 is discharged as waste water, the liquid is discharged from the three-way valve 66 to the branch flow path 67.

The separation mechanism 7 uses heat and thermoelectric convection to provide a function same as that of the mixing box 2, the separation mechanism 3 and the ion exchange membrane 6. Specifically, by heating the chemical solution to cause thermoelectric convection in the chemical solution, the separation mechanism 7 changes the pH of the chemical solution to produce metal particles, removes metal particles having a particle size outside a predetermined range from the chemical solution, and leaves metal particles having a particle size within the predetermined range in the chemical solution. As is known in the field of micro flow path, particle sizes of particles contained in a liquid can be sorted out by laser heating or applying an electric field to a flow path through which the liquid flows. This method is applied to the metal particles in the chemical solution in the separation mechanism 7. An example of the thermoelectric convection is Marangoni convection caused by laser heating.

Therefore, the separation mechanism 7 removes the metal particles having a particle size outside the predetermined range, and discharges the chemical solution in which the metal particles having a particle size within the predetermined range remain from the separation mechanism 7 to the branch flow path 62. On the other hand, the branch flow path 63 is used to discharge waste water generated at the separation mechanism 7.

Here, the separation mechanism 3 of the first embodiment, by filtering the chemical solution with the filtration membrane, removes the metal particles having a particle size larger than the fixed value from the chemical solution, and leaves the metal particles having a particle size of the fixed value or less in the chemical solution. This also applies to the ion exchange membrane 6 of the second embodiment. In these two cases, an upper limit of the particle size of the metal particles to be supplied to the substrate W can be set, but a lower limit of the particle size of the metal particles to be supplied to the substrate W cannot be set. On the other hand, according to the separation mechanism 7 of the present embodiment, not only the upper limit of the particle size of the metal particles but also the lower limit of the particle size of the metal particles can be set.

According to the present embodiment, similar to the first and second embodiments, a substrate treatment device that is capable of appropriately supplying metal particles to the substrate W can be achieved.

Hereinafter, modifications of the first to third embodiments will be described. A method of the following modification is performed using, for example, the device in FIG. 3. However, although the chemical solution and the alkali aqueous solution are sequentially discharged to the substrate W in the description with reference to FIG. 3, such sequential discharge may not be performed in the following modifications.

The metal particles in the chemical solution to be supplied to the substrate W may include metal nanoparticles having a particle size less than 1 micrometer (μm). There is an advantage that the metal nanoparticles are not likely to adhere to the tubes since the metal nanoparticles are subjected to surface treatment so as not to aggregate with each other in the chemical solution. For example, an organic self-assembled monolayer is formed on a surface of the metal nanoparticle. With the organic self-assembled monolayer, aggregation between the metal particles and tube adhesion can be controlled. In this case, a solvent of the chemical solution may be water or an organic solvent. The metal particles in the chemical solution to be supplied to the substrate W may be formed of organometallic complexes having the same molecular weight. Further, since the metal particles in this case are metal nanoparticles, the chemical solution containing the metal nanoparticles can be supplied to the substrate W without being treated with an acid or an alkali.

After the surface of the substrate W is terminated with an organic amine compound in advance to form a coating film, an acidic chemical solution may be supplied to the substrate W. Since the organic amine compound has a function equivalent to that of the alkali aqueous solution, it is not necessary to mix the chemical solution and the alkali in advance, and metal contamination of the device and the tubes thereof can be prevented. If the surface of the substrate W is terminated with the organic amine compound in advance, even when the sequential discharge as in the case of FIG. 3 is not performed, a neutralization reaction can be caused between the coating film of the organic amine compound and the chemical solution by supplying the acidic chemical solution to the substrate W, and the metal particles can be supplied to the substrate W. An example of the organic amine compound is triazine.

Alternatively, a method, in which a thin metal film (for example, a thin Ni film) is formed in advance on the surface of the substrate W by sputtering, an acid is supplied to the thin metal film to dissolve the thin metal film, and thereafter an alkali is supplied to the substrate W, may be adopted. Accordingly, even when the acid or alkali does not contain the metal particles, the metal particles can be produced from dissolved metal from the thin metal film, and the metal particles can be supplied to the substrate W. Instead of dissolving the thin metal film by supplying the acid to the thin metal film, the thin metal film may also be dissolved by supplying the alkali to the substrate W.

The coating film of the amine compound and/or the thin metal film are formed after the amorphous film shown in FIG. 2 is formed on the substrate W.

After the surface of the substrate W is negatively charged by spraying, a chemical solution containing metal ions may be supplied to the substrate W. Accordingly, the metal particles can be supplied to the substrate W by reducing the metal ions with negative charges on the surface of the substrate W.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate treatment device, comprising:
   a dilutor configured to dilute a first liquid containing a metal ion and exhibiting acidity;
   a pH changer configured to change a potential Hydrogen (pH) of the diluted first liquid to provide a plurality of metal hydroxides from the metal ion;
   a first branch flow path provided between the dilutor and the pH changer; and
   a second branch flow path configured to discharge the diluted first liquid from the dilutor; and
   a substrate conditioner configured to treat a substrate using the metal hydroxides.

2. The substrate treatment device according to claim 1, wherein
   the pH changer is further configured to remove a first subset of the plurality of metal hydroxides with a particle size outside a predetermined range from the diluted first liquid, and leave a second subset of the plurality of metal hydroxides with a particle size within the predetermined range in the diluted first liquid, and
   the substrate conditioner is further configured to treat the substrate with the diluted first liquid containing the second subset of metal hydroxides.

3. The substrate treatment device according to claim 2, wherein
   the pH changer is further configured to, by filtering the diluted first liquid, remove the first subset of metal hydroxides, and leave the second subset of metal hydroxides.

4. The substrate treatment device according to claim 2, wherein the pH changer is further configured to, by treating the diluted first liquid with an ion exchange membrane, change the pH of the diluted first liquid, remove the second subset of metal hydroxides, and leave the first subset of metal hydroxides.

5. The substrate treatment device according to claim 4, wherein
the pH changer includes a recovery component that is configured to supply an acid or an alkali to the ion exchange membrane to recover an ion exchange group of the ion exchange membrane.

6. The substrate treatment device according to claim 2, wherein
the pH changer is further configured to, by heating the diluted first liquid to cause thermoelectric convection in the diluted first liquid, change the pH of the diluted first liquid, remove the second subset of metal hydroxides, and leave the first subset of metal hydroxides.

7. The substrate treatment device according to claim 1, wherein
the pH changer is further configured to change the pH of the diluted first liquid by mixing the diluted first liquid with a second liquid that exhibits alkalinity or acidity.

8. The substrate treatment device according to claim 1, wherein the substrate conditioner includes a discharging branch flow path downstream of the pH changer and configured to provide the diluted first liquid to the substrate,
wherein a third branch flow path is provided between the pH changer and the discharging branch flow path, the third branch flow path configured to discharge a liquid from the pH changer.

9. The substrate treatment device according to claim 1, wherein the substrate conditioner comprises:
a table configured to rotate the substrate, and
a first nozzle configured to supply alkali to the substrate.

10. The substrate treatment device according to claim 9, wherein the substrate conditioner further comprises:
a second nozzle configured to supply water to the substrate.

11. The substrate treatment device according to claim 10, wherein the substrate conditioner further comprises:
a third nozzle configured to provide the diluted first liquid to the substrate.

* * * * *